United States Patent
Iza et al.

(10) Patent No.: US 8,183,557 B2
(45) Date of Patent: May 22, 2012

(54) (AL,IN,GA,B)N DEVICE STRUCTURES ON A PATTERNED SUBSTRATE

(75) Inventors: Michael Iza, Santa Barbara, CA (US); Hitoshi Sato, Kanagawa (JP); Eu Jin Hwang, Jeonju (KR); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 601 days.

(21) Appl. No.: 12/234,311

(22) Filed: Sep. 19, 2008

(65) Prior Publication Data

US 2009/0072262 A1   Mar. 19, 2009

Related U.S. Application Data

(60) Provisional application No. 60/973,671, filed on Sep. 19, 2007.

(51) Int. Cl.
    *H01L 33/32*   (2010.01)
(52) U.S. Cl. ... 257/22; 257/103; 257/615; 257/E33.008; 438/47
(58) Field of Classification Search ........... 257/E33.028, 257/E33.033, E33.034
    See application file for complete search history.

(56) References Cited

U.S. PATENT DOCUMENTS

| | | |
|---|---|---|
| 6,316,785 B1 | 11/2001 | Nunoue et al. |
| 6,447,604 B1 | 9/2002 | Flynn et al. |
| 7,084,421 B2 | 8/2006 | Koike et al. |
| 2002/0144645 A1 | 10/2002 | Kim et al. |
| 2003/0024475 A1 | 2/2003 | Anderson |
| 2005/0056824 A1* | 3/2005 | Bergmann et al. ............... 257/14 |
| 2005/0142391 A1 | 6/2005 | Dmitriev et al. |
| 2005/0161697 A1 | 7/2005 | Nakahata et al. |
| 2005/0214992 A1 | 9/2005 | Chakraborty et al. |
| 2005/0224783 A1 | 10/2005 | Matsuyama et al. |
| 2005/0258451 A1 | 11/2005 | Saxler et al. |
| 2006/0006375 A1 | 1/2006 | Ou et al. |
| 2006/0192195 A1* | 8/2006 | Lee ................................... 257/14 |
| 2006/0286782 A1 | 12/2006 | Gaska et al. |
| 2010/0044718 A1 | 2/2010 | Hanser et al. |

OTHER PUBLICATIONS

Shao, Y-P. et al., "Electrical Characterization of Semipolar Gallium Nitride Thin Films," NNIN REU Research Accomplishments, Aug. 2005, pp. 132-133.
International Search Report application No. PCT/US08/77064, International filed Sep. 19, 2008, mailed on Dec. 3, 2008.
Kim, C. et al., "Structural Characterization of GaN Epilayers Grown on Patterned Sapphire Substrates," Mater. Res. Soc. Symp. Proc., 2005, vol. 864.
Nakamura, S. et al., "$In_xGa_{(1-x)}N/In_yGa_{(1-y)}N$ superlattices grown on GaN films," J. Appl. Phys. 74 (6), Sep. 15, 1993, 3911. Tadatomo, K. et al., "High Output Power InGaN Ultraviolet Light-Emitting Diodes Fabricated on Patterned Substrates Using Metalorganic Vapor Phase Epitaxy," Phys. Stat. Sol. (a), 2001, pp. 121-125, vol. 188, No. 1.
Wang, W., et al., "Efficiency Improvement of Near-Ultraviolet InGaN LEDs Using Patterned Sapphire Substrates," IEEE J. of Quantum Electronics, Nov. 2005, pp. 1403-1409, vol. 41, No. 11.
Yamada, M. et al., "In GaN-Based Near-Ultraviolet and Blue-Light-Emitting Diodes with High External Quantum Efficiency Using a Patterned Sapphire Substrate and a Mesh Electrode," Jpn. J. Appl. Phys., Dec. 15, 2002, pp. L1431-L1433, vol. 41, Part 2, No. 12B.

* cited by examiner

*Primary Examiner* — Stephen W Smoot
(74) *Attorney, Agent, or Firm* — Gates & Cooper LLP

(57) ABSTRACT

A nitride light emitting diode, on a patterned substrate, comprising a nitride interlayer having at least two periods of alternating layers of $In_xGa_{1-x}N$ and $In_yGa_{1-y}N$ where $0<x<1$ and $0\leq y<1$, and a nitride based active region having at least one quantum well structure on the nitride interlayer.

27 Claims, 6 Drawing Sheets

(AL,IN,GA,B)N DEVICE STRUCTURES ON A PATTERNED SUBSTRATE

CROSS REFERENCE TO RELATED APPLICATIONS

This application claims the benefit under 35 U.S.C. Section 119(e) of now abandoned and commonly-assigned U.S. Provisional Patent Application Ser. No. 60/973,671, filed on Sep. 19, 2007, by Michael Iza, Hitoshi Sato, Eu Jin Hwang, Steven P. DenBaars and Shuji Nakamura, entitled "(Al, In, Ga, B)N DEVICE STRUCTURES ON A PATTERNED SUBSTRATE," which application is incorporated by reference herein.

This application is related to the following co-pending and commonly-assigned U.S. patent application:

U.S. Utility patent application Ser. No. 12/102,612 filed on Apr. 14, 2008, by Michael Iza, Steven P. DenBaars and Shuji Nakamura, entitled "METHOD FOR DEPOSITION OF (Al, In, Ga, B)N," which application claims the benefit under 35 U.S.C. Section 119(e) of U.S. Provisional Patent Application Ser. No. 60/911,323 filed on Apr. 12, 2007, by Michael Iza, Steven P. DenBaars and Shuji Nakamura, entitled "METHOD FOR DEPOSITION OF (Al, In, Ga, B)N,"

which application is incorporated by reference herein.

BACKGROUND OF THE INVENTION

1. Field of the Invention

This invention relates to nitride based device structures on patterned substrates, such as nitride based light emitting diode (LED) structures on patterned substrates, having enhanced performance.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

The usefulness of gallium nitride (GaN), and its ternary and quaternary compounds incorporating aluminum and indium (AlGaN, InGaN, AlInGaN), has been well established for fabrication of visible and ultraviolet optoelectronic devices and high-power electronic devices. These devices are typically grown epitaxially using growth techniques including molecular beam epitaxy (MBE), metalorganic chemical vapor deposition (MOCVD), and hydride vapor phase epitaxy (HVPE).

Nitride based optoelectronic devices began their quick ascent into commercialization with the advent of the use of a thin nucleation layer prior to the deposition of high quality GaN. This technique is employed due to the lack of a native substrate available for GaN growth. Later techniques such as the development of p-type GaN by magnesium doping followed by high temperature anneal also proved vital. However, the development of using InGaN as the active layer for short wavelength devices allowed nitride based Light Emitting Diodes (LEDs) and laser diodes (LDs) to overtake many other research ventures and has now become the dominant material system used for visible light semiconductor applications.

The external quantum efficiency or total efficiency ($\eta_L$) of LEDs can be defined by the following equation:

$$\eta_L = \eta_{int}\eta_{inj}\eta_{ext}$$

where the extraction efficiency, $\eta_{ext}$, is defined as the amount of photons extracted, the injection efficiency, $\eta_{inj}$, is defined as the amount of carriers injected into the active region of the device, and the internal quantum efficiency, $\eta_{int}$, is defined as the amount of photons generated in the active region of the device. The internal quantum efficiency of a device can be maximized by reducing the number of non-radiative centers, such as defects and impurities. The internal quantum and injection efficiency of blue nitride based LEDs have already been improved to a high level by optimizing the deposition conditions of the device layers. Therefore, further improvement in external efficiency of a device would require improvement in the extraction efficiency.

The extraction efficiency of nitride based devices grown on sapphire is hampered by the difference in the refractive index between nitride films and sapphire. This refractive difference, in turn, causes internal reflections which can "trap" the light generated in the active region. Therefore, most of the light that is generated propagates through the nitride film and cannot be used as useful light.

One approach to improve light extraction from nitride devices is to use a patterned substrate on which the device is subsequently grown. A patterned substrate is defined as any substrate which has been processed to produce surface features which include (but are not limited to): stripes, semicircles, pyramids, mesas of different shapes, et cetera. The pattern on the substrate aids in extracting the light emission from the active region of the device by the suppression of light interference. Early work of growth on patterned sapphire wafers by Tadatomo et al. initially tried to reduce the dislocation density of the nitride film by growing on patterned grooves or stripes along different crystal growth directions [1]. This was done in order to avoid a two step growth procedure, commonly referred to as Lateral Epitaxial Overgrowth (LEO), which uses a patterned $SiO_2$ stripe deposited atop an as-grown nitride film, in order to reduce the dislocation density of the nitride film grown atop the stripes. The LEO process is cumbersome due to the fact that the wafer must be removed from the reactor in order to deposit the $SiO_2$ stripes and then re-introduced into the reactor for regrowth of nitride films atop the patterned nitride film. Thus, the advantage of growing on a patterned substrate is that the growth can be performed in one deposition step compared to the two steps of the LEO process.

Further improvements of LED devices grown on patterned substrates showed enhanced light extraction by use of various types of pattern designs [2]. These devices exhibited increased output powers and luminous efficiency compared to LED devices grown on non-patterned substrates. However, these devices employed the use of a standard LED structure. A standard LED structure is described as a structure comprising a sapphire or silicon carbide substrate, a buffer made of GaN or AlGaN, an n-contact layer made of GaN doped with silicon, an active layer made of a single quantum well (QW) or multiple quantum well (MQW) containing InGaN, an electron blocking layer made of AlGaN, and a p-contact layer made of GaN doped with magnesium. This device structure was shown to work well at a forward current of 20 mA, with a light emission at 450 nm, and an output power of 10-15 mW.

Although this standard device structure has worked well for non-patterned substrates, this standard structure has exhibited detrimental performance in output power at equivalent drive currents when used with a patterned substrate. Thus, there is a need for improved device structures in order to increase performance of nitride based LEDs deposited on patterned substrates. The present invention addresses this issue by the use of a device structure which includes a nitride based interlayer located adjacent to the active region of the device.

As stated previously, the current technology used in device structures of nitride LEDs on patterned substrates does not employ the use of a nitride based interlayer. This invention allows for the realization of high output power LEDs grown on patterned substrates. Although the use of a nitride interlayer has been shown to enhance the output power of LEDs grown on conventional non-patterned substrates, a scientific consensus on why this occurs has not been reached [3].

The present invention distinguishes itself from above mentioned device designs by the use of a nitride interlayer on a patterned substrate in order to improve the performance of light emitting devices. As a result, there is a need for improved device design structures on patterned substrates, wherein the device structure minimizes the deleterious effects present in conventional light emitting device structures deposited on patterned substrates. The present invention satisfies this need.

SUMMARY OF THE INVENTION

To overcome the limitations in the prior art described above, and to overcome other limitations that will become apparent upon reading and understanding the present specification, the present invention discloses nitride based device structures on patterned substrates, such as nitride based light emitting diode (LED) structures on patterned substrates, which enhances the light emitting output power of the nitride based device structures. Improving the light emission efficiency leads to an improvement in the electronic efficiency characteristics of the nitride based device structures, and in turn can lead to the expansion of nitride semiconductor device applications into various commercial products.

The present invention also enhances the light output power characteristics by drastically improving the properties of the active layer of a multiple quantum well structure grown on patterned substrates. This improvement can lead to the expansion of the use of patterned substrates which have been shown to improve the light extraction of LED devices.

A first nitride semiconductor device of the present invention comprises a patterned substrate and incorporates a nitride interlayer containing at least some indium. This nitride interlayer can be located on any part of the device, preferably above the active region of the device, and more preferably located below the active region of the device. It is also noted that the active layer is made of a nitride semiconductor containing at least some indium, preferably made of InGaN having a single or multiple quantum well. A bandgap of the at least one quantum well may be less than a bandgap of the nitride interlayer.

Further, the first nitride semiconductor device of the present invention comprises an n-region having a plurality of nitride semiconductor films on a patterned substrate. At least one of the nitride semiconductor layers of the n-region has an n-side multi-film layer, comprising of alternating first nitride semiconductor films containing indium, and second nitride semiconductor films having different composition from the first nitride semiconductor films. Each of the first nitride semiconductor films and each of the second nitride semiconductor films are laminated alternately, and at least one of the first nitride semiconductor films and the second nitride semiconductor films have a thickness less than 100 Angstroms, with a total multi-layer film thickness of less than 300 nm. These first and second alternating layers will henceforth be referred to as the nitride interlayer film.

Further, in the first nitride semiconductor device, the nitride interlayer film can alternatively be comprised of a single nitride film, containing at least some indium, with a total thickness of less than 300 nm.

The nitride LED may comprise an n-type layer and a p-type layer; a nitride interlayer, between the n-type layer and the p-type layer, having at least two periods of alternating layers of Indium (In) containing layers with a different In composition; and a nitride based active region formed on or above the nitride interlayer, and in between the n-type layer and the p-type layer, including at least one quantum well structure.

In the first nitride semiconductor device of the present invention, it is preferable that the nitride interlayer film is made of $In_xGa_{1-x}N$ (0<x<1), preferably x<0.3, and more preferably x=0.05.

The two periods of alternating layers may comprise at least two first nitride layers interleaved with at least two second nitride layers. In the first nitride semiconductor device of the present invention, it is preferable that the nitride interlayer film is made of alternating layers of $In_xGa_{1-x}N$ (0<x<1) and $In_yGa_{1-y}N$ (0≦y<1, y<x), preferably with x<0.3 and y<0.3, and more preferably with x=0.05 and y=0. However, the values the present invention is not limited to particular values of x and y, for example 0≦y<1 may be used. The first layers may contain indium and the second layers may contain substantially no indium, for example.

Further, in the first nitride semiconductor device of the present invention, the first nitride semiconductor films may differ in thickness from each other, and/or the second nitride semiconductor films may differ in thickness from each other. Thus, where the multi-film layer is alternately laminated with a plurality of first and second nitride semiconductor films, the two first (second) nitride semiconductor films sandwiching a second (first) nitride semiconductor film may have different thickness from each other.

The two periods of alternating layers may have a thickness smaller than a critical elastic thickness of a nitride, so that the nitride interlayer acts as a buffer layer for improving the crystal quality of the active region as compared to the case when the alternating layers are grown with a thickness greater than the critical thickness. A first layer's thickness may increase or decrease as a distance from the first layer to the active layer decreases, in order to vary a refractive index of the alternating layers.

Further, in the first nitride semiconductor device of the present invention, the first nitride semiconductor films may differ in Group III element content from each other, and/or the second nitride semiconductor films may differ in Group III element content from each other. Thus, where the multi-film layer is alternately laminated with a plurality of first and second nitride semiconductor films, the two first (second) nitride semiconductor films sandwiching a second (first) nitride semiconductor film may have different composition ratio of Group III element(s). A first layer's indium composition may increase or decrease as a distance from the first layer to the active layer decreases, in order to vary a refractive index of the alternating layers.

Further, in the first nitride semiconductor device of the present invention, the n-side nitride interlayer film may be spaced away from the active layer, but preferably is formed in contact with the active layer in order to improve the output power characteristics.

Further, in the first nitride semiconductor device of the present invention, both the first nitride semiconductor films and the second nitride semiconductor films are not doped with an impurity. The term of "undoped" represents the status of not being doped intentionally, including where the impurity diffuses from the adjacent nitride semiconductor layers according to the present invention. The impurity concentration due to such diffused impurity often has a gradient concentration in the layers.

Further, in the first nitride semiconductor device of the present invention, the n-type impurity is doped in any of the first nitride semiconductor films and the second nitride semiconductor films. This is referred to as modulation doping, and by being modulation doped, the output can also be improved. It is to be noted that the n-type impurity can be selected from Group IV and Group VI elements such as Si, Ge, Sn, and S, and preferably Si or Sn is used for the n-type impurity.

Further, in the first nitride semiconductor device of the present invention, the n-type impurity is doped in both the first nitride semiconductor films and the second nitride semiconductor films. Where the n-type impurity is doped, the concentration is adjusted to be $5\times10^{21}/cm^3$ or less, and preferably $1\times10^{20}/cm^3$ or less. Where it is more than $5\times10^{21}/cm^3$, the nitride semiconductor film has a poor crystal quality so that the output tends to be reduced. This is also adapted for the case where modulation doping is used.

The present invention also improves the light output power of the active region on patterned substrates and enhances the light extraction efficiency of light emitting diodes through the use of a Transparent Conducting Oxide (TCO). The p-contact layers are typically comprised of a plurality of thin metallic layers containing nickel and/or gold. The typical thickness of these layers is less than 20 nm. Although these layers can form ohmic contacts to p-type GaN, they have also been shown to absorb some of the light emitted from the device, thereby drastically decreasing the total efficiency of the device.

A second nitride semiconductor device is structured in order to enhance the light extraction efficiency of the device, thereby improving the total efficiency of the device. The second nitride semiconductor device of the present invention comprises a combination of the first device as stated in the above description, with the addition of a TCO film laminated atop the p-type nitride film of the device.

In addition, the second nitride semiconductor device is further comprised of a TCO located adjacent to the p-type nitride in order to serve as a transparent contact film. Thus, the TCO layer may be used as a p-type contact to the p-type nitride layer.

In addition, the TCO can be comprised of a transparent conducting oxide, such as zinc oxide (ZnO) or indium tin oxide (ITO)

Further, in the second device of the present invention, the TCO films and the second nitride semiconductor films are not doped with an impurity. The term "undoped" represents the status not being doped intentionally, including where the impurity is diffused from the adjacent nitride semiconductor layers according to the present invention. The impurity concentration due to such diffused impurity often has a gradient concentration in the layers.

Further, in the second device of the present invention, the TCO films can be comprised of multiple layers of various compositions.

Further, the TCO of the second device can be patterned or shaped in order to enhance light extraction.

In addition, this invention reduces the forward voltage, $V_f$, of a light emitting diode device on a patterned substrate with a TCO, through the use of a tunnel junction layer located between the p-type semiconductor and the TCO, which comprises a third nitride device of the present invention.

Further, the tunnel junction layer may comprise a nitride layer containing at least some gallium. This nitride layer can be unintentionally doped, but is preferably doped with an n-type impurity such as silicon, with doping concentration greater than $1\times10^{18}/cm^3$, and more preferably greater than $5\times10^{19}/cm^3$.

Further, the tunnel junction layer may comprise a nitride layer containing at least some indium. This nitride layer can be unintentionally doped, preferably doped with an n-type impurity such as silicon, with doping concentration greater than $1\times10^{18}/cm^3$, and more preferably $5\times10^{19}/cm^3$.

This invention increases the light extraction of the LED by patterning or shaping the TCO, as described by fourth and fifth nitride semiconductor devices of the present invention. The shaping can be achieved through physical and/or chemical processes and may comprise of various shapes or sizes.

The first, second, third, fourth, and fifth devices of the present invention describe nitride light emitting device structures incorporating a nitride interlayer deposited on a patterned substrate which can also be combined with a patterned or non-patterned TCO and/or a tunnel junction. The patterned substrate may comprise of any pattern, shape or design. The structure may further comprise of any device or structure grown atop the nitride film which incorporates (or comprises) a nitride interlayer on a patterned substrate and which may also incorporate (or comprise) a TCO and/or a tunnel junction.

Further, the present invention also includes any combination of the first, second, third, fourth, and fifth devices which incorporates a nitride interlayer grown on a patterned substrate, as described above for the first device.

The nitride interlayer film may comprise multiple layers having varying or graded compositions, a heterostructure comprising layers of dissimilar (Al, Ga, In, B)N composition, or one or more layers of dissimilar (Al, Ga, In, B)N composition. The nitride interlayer film may comprise of unintentionally doped or intentionally doped layers, with elements such as iron, magnesium, silicon, oxygen, carbon, and/or zinc. The nitride interlayer film may be grown using deposition methods comprising HVPE, MOCVD or MBE.

The structure may further comprise the nitride interlayers grown in any crystallographic nitride direction, such as on a conventional c-plane oriented nitride semiconductor crystal, or on a nonpolar plane such as a-plane or m-plane, or on any semipolar plane the patterned substrate is a patterned sapphire substrate having its principal surface represented by a c-face, r-face or a-face.

The patterned substrate may be a patterned sapphire insulating substrate of spinel ($MgAl_2O_4$), a patterned semiconductor substrate made of SiC (including 6H, 4H or 3C), Si, ZnO, GaAs, or GaN. The patterned substrate may be comprised of semipolar or nonpolar surfaces of gallium nitride (GaN).

The present invention also discloses a device having enhanced properties using the above described structures.

The present invention further discloses a method of fabricating a nitride light emitting diode on a patterned substrate, comprising forming a nitride interlayer, between an n-type layer and a p-type layer, wherein the nitride interlayer has at least two periods of alternating layers of Indium (In) containing layers with a different In composition; and forming a nitride based active region on or above the nitride interlayer, and in between the n-type layer and the p-type layer, wherein the nitride based active region includes at least one quantum well structure. The present invention further comprises a method of emitting light from a nitride light emitting diode on a patterned substrate, comprising emitting light from a nitride based active region on or above the nitride interlayer, and in between the n-type layer and the p-type layer, wherein the nitride based active region includes at least one quantum well structure.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes nitride light emitting device structures incorporating a nitride interlayer deposited on a patterned substrate via MOCVD. The use of nitride based interlayer structures incorporated into light emitting devices offers a means of improving the nitride light emitting device performance. The term nitrides refers to any alloy composition of the (Ga, Al, In, B)N semiconductors having the formula $Ga_nAl_xIn_yB_zN$ where:

$$0 \leq n \leq 1, 0 \leq x \leq 1, 0 \leq y \leq 1, 0 \leq z \leq 1 \text{ and } n+x+y+z=1$$

Current nitride light emitting devices structures deposited on patterned substrates are comprised of structures without a nitride interlayer. These structures show a drastic degradation in device performance, for a power output at a constant current. Nitride light emitting device structures incorporating a nitride interlayer provide a means of enhancing the performance of nitride LEDs by greatly enhancing the device output power at constant current. The present invention provides a means of enhancing nitride device performance of nitride LEDs deposited on patterned substrates.

Technical Description

Embodiment 1

Figure 1:
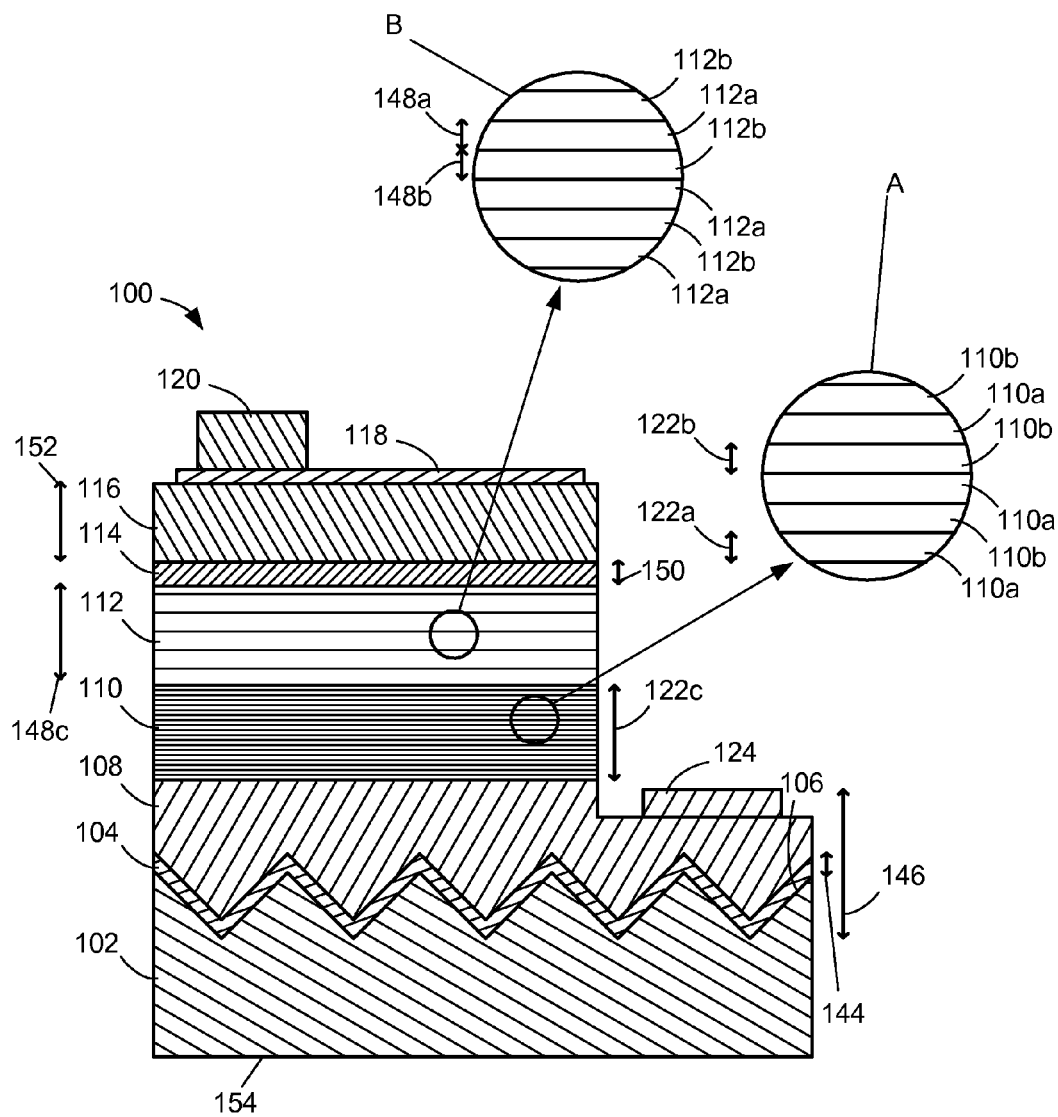
FIG. 1 is a cross-sectional schematic of the first nitride semiconductor device of the present invention, comprising of a patterned substrate and incorporating a nitride interlayer containing at least some indium.

FIG. 1 is a schematic sectional view showing the structure of a nitride semiconductor device (an LED device) 100 according to embodiment 1 of the present invention. This LED 100 comprises a patterned sapphire substrate 102, and deposited successively in the following order on the substrate 102: a first buffer layer 104 made of GaN (closest to the substrate 102 surface 106), an n-contact layer 108 made of GaN doped with silicon, an n-side multi-layer film made of an InGaN/GaN superlattice structure 110 (which may comprise layers 110a and 110b), an active layer 112 comprising a multiple quantum well structure made of InGaN/GaN (which may comprise layers 112a and 112b), a p-side AlGaN electron blocking layer 114 doped with magnesium, a p-contact layer 116 comprising GaN doped with magnesium, a thin transparent p-contact layer 118, and a thick p-pad layer 120 that is the furthest from the substrate 102 patterned surface 106.

The LED device 100 has the active layer 112 of the multi quantum well structure sandwiched between an n-region comprising the first buffer layer 104, the n-contact layer 108, and the n-side nitride multi-layer 110, and a p-region comprising the p-side AlGaN electron blocking layer 114 and the p-contact layer 116.

The nitride semiconductor device 100 comprises the n-side multi-film layer 110 beneath the active layer 112 in the n-region, depositing, as shown in a magnified callout A in FIG. 1, a first nitride semiconductor film 110a containing In and a second nitride semiconductor film 110b of a composition different from that of the first nitride semiconductor film 110a. The n-side multi-film layer 110 comprises at least one of each of the first nitride semiconductor film 110a and the second nitride semiconductor film 110b, and preferably comprises more than three films in total and more preferably at least two of each film 110a and 110b, i.e. more than 4 films in total.

Figure 2:
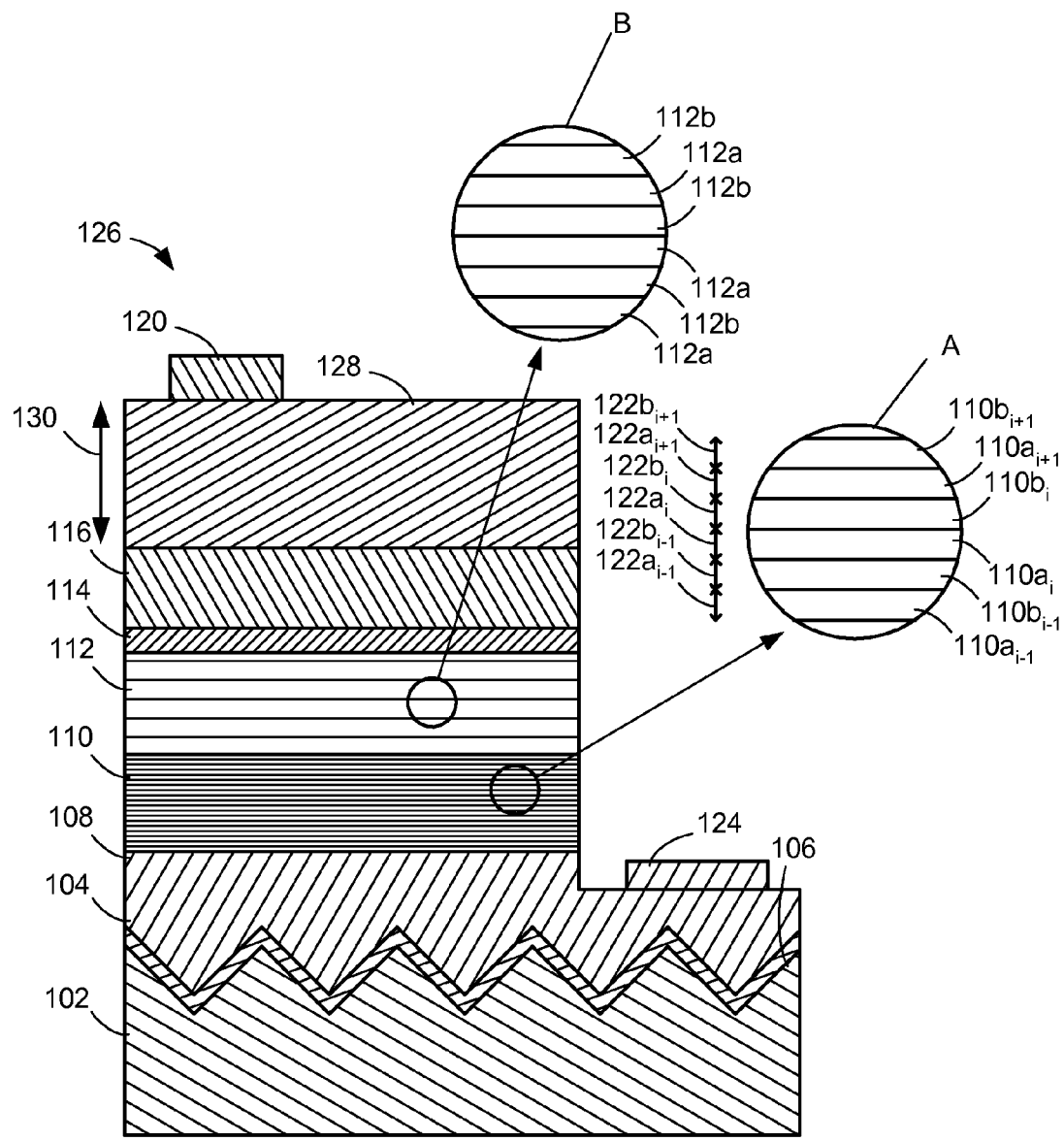
FIG. 2 is a cross sectional schematic of the second nitride semiconductor device of the present invention, comprising of a combination of the first device, as shown in FIG. 1, with the addition of a TCO film laminated atop the p-type nitride film.

FIG. 2 shows that the multi-film layer 110 may comprise a sequence of first nitride semiconductor films $110a_{i-1}$, $110a_i$, $110a_{i+1}$ interleaved with a sequence of second nitride semiconductor films $110b_{i-1}$, $110b_i$, $110b_{i+1}$, where i is an integer indexing the number of films. However, where the properties of the individual films $110a_i$, $110a_{i-1}$, and $110a_{i+1}$ ($110b_i$, $110b_{i-1}$, and $110b_{i+1}$) are similar, the films $110a_i$, $110a_{i-1}$, and $110a_{i-1}$ ($110b_i$, $110b_{i-1}$, and $110b_{i+1}$) will generally be referred to as 110a (110b) as shown in FIG. 1.

Where the n-side multi-film layer 110 is formed in contact with the active layer 112, as is shown in FIG. 1, one of the nitride semiconductor films 110a and 110b which is held in contact with an initial layer (a barrier layer 112a or a well layer 112b) of the active layer 112 may be either the first nitride semiconductor film 110a or the second nitride semiconductor film 110b.

The depositing sequence of the nitride films 110a and 110b in the n-side multi-film layer 110 may be arbitrarily chosen. Also, although the n-side multi-film layer 110 is formed in direct contact with the active layer 112 in the illustrated embodiment, another layer made of an n-type nitride semiconductor may intervene between the n-side multi-film layer 110 and the active layer 112.

At least one first nitride semiconductor film 110a having thickness 122a, and at least one second nitride semiconductor film 110b having a thickness 122b is designed to have a film thickness 122a, 122b, not greater than 100 Angstroms, preferably not greater than 70 Angstroms, and more preferably not greater than 50 Angstroms. The thicknesses 122a and 122b may be different, for example. As shown in FIG. 2, when the film $110a_i$ has a thickness $122a_i$ and the film $110b_i$ has a thickness $122b_i$, wherein both thicknesses $122a_i$ and $122b_i$ are within the above-mentioned range, since the films $110a_i$ and $110b_i$ are thinner than a critical elastic thickness, the crystal quality of the first $110a_{i+1}$ (or second $110b_i$) nitride semiconductor film deposited on such thin film $110b_i$ ($110a_i$) can be improved, thereby improving the crystal quality of the n-side multi-film layer 110 as a whole, to increase the output capability of the device 100. The layer 110 has a thickness 122c.

The at least one first nitride semiconductor film 110a is made of a nitride semiconductor containing In, preferably a ternary compound which is expressed by the formula $In_xGa_{1-x}N$ (0<x<1), wherein x is preferably not greater than 0.5 and more preferably not greater than 0.1.

On the other hand, the at least one second nitride semiconductor film 110b may be made of any suitable nitride semiconductor, provided that the nitride semiconductor material of the film 110b is different from the nitride semiconductor used for the at least one first nitride semiconductor film 110a. In order, however, for the at least one second nitride semiconductor film 110b to retain an excellent crystal quality, a nitride semiconductor of a binary or ternary compounds having a bandgap higher than the at least one first nitride semiconductor film 110a should be used, although the present invention is not exclusively limited to these compounds. If among the various nitride semiconductors, GaN is chosen as a material for the at least one second nitride semiconductor film 110b, a multi-film layer having an excellent crystal quality can be formed. Accordingly, the use of $In_xGa_{1-x}N$, wherein x is not greater than 0.5, for the at least one first nitride semiconductor film 110a, and GaN for the at least one second nitride semiconductor film 110b is a preferred combination of materials.

In one embodiment, any one of the first and second nitride semiconductor films 110a and 110b has a film thickness 122a, 122b not greater than 100 Angstroms, preferably not greater than 70 Angstroms and more preferably not greater than 50 Angstroms. Selection of the film thickness 122a, 122b not greater than 100 Angstroms for each of the first and second nitride semiconductor films 110a and 110b means that the respective nitride semiconductor films 110a and 110b can have a film thickness 122a, 122b not greater than the critical elastic thickness and, therefore, a nitride semiconductor 110a, 110b having an excellent crystal quality can be grown as compared with the case in which the films 110a and 110b are grown into a thick film. Selection of the film thickness 122a, 122b not greater than 70 Angstroms is effective in creating the multi-film layer 110 into a superlattice structure and, therefore, when the active layer 112 is subsequently grown on this superlattice multi-film layer 110 having an excellent crystal quality, the multi-film layer 110 can have a function similar to that of a buffer layer, allowing the active layer 112 to be grown having an excellent crystal quality.

In another embodiment, the first nitride semiconductor films $110a_i$ may have different thicknesses $122a_i$, and the second nitride semiconductor films $110b_i$ may have different thicknesses $122b_i$. For example, at least one of the first (second) nitride semiconductor films $110a_i$ ($110b_i$) can have a film thickness $122a_i$ ($122b_i$) different from that of the next neighboring first (second) nitride semiconductor films $110a_{i-1}$ ($110b_{i-1}$) and $110a_{i+1}$ ($110b_{i+1}$) (i.e., the thickness $122a_i$ ($122b_i$) of the film $110a_i$ ($110b_i$) can be different from the thickness $122a_{i-1}$ ($122b_{i-1}$) of the film $110a_{i-1}$ ($110b_{i-1}$) and/or the thickness $122a_{i+1}$ ($122b_{i+1}$) of the film $110a_{i+1}$ ($110a_{i+1}$), which are respectively below and above the film $110a_i$ ($110b_i$) in the sequence of first 110a (second 110b) nitride semiconductor films). By way of further example, assuming that the first nitride semiconductor film 110a is made of InGaN and the second nitride semiconductor film 110b is made of GaN, the InGaN layer $110a_i$ intervening between the neighboring GaN layers $110b_i$ and $110b_{i-1}$ may have a varying film thickness $122a_i$ either increasing or decreasing as the distance from the layer $110a_i$ to the active layer 112 decreases. In so doing, the multi-film layer 110 can have a varying index of refraction with the nitride semiconductor films $110a_i$ and $110b_i$ having different indexes of refraction and, consequently, the multi-film layer 110 can exhibit substantially the same effects as those of a grading composition nitride semiconductor layer. Accordingly, in a semiconductor device such as a semiconductor laser of a type requiring the use of a beam waveguide, the multi-film layer 110 can provide the beam waveguide to adjust the mode of the laser beam.

The thickness of layers $110b_i$ may also vary as the distance to the active layer 112 decreases.

Also, at least one of the first 110a (second 110b) nitride semiconductor films may contain a composition of Group III elements that is different from the composition in the next neighboring first 110a (second 110b) nitride semiconductor film. For example, the composition of the film $110a_i$ ($110b_i$) can be different from the composition of the films $110a_{i-1}$ ($110b_{i-1}$) and/or $110a_{i+1}$ ($110b_{i+1}$) which are respectively below and above the film $110a_i$ ($110b_i$) in the sequence of first 110a (second 110b) nitride semiconductor films. By way of further example, assuming that the first nitride semiconductor films 110a are made of InGaN and the second nitride semiconductor films 110b are made of GaN, the amount of In contained in the InGaN layer $110a_i$ intervening between the neighboring GaN layers $110b_i$ and $110b_{i-1}$ may be increased or decreased as the distance from $110a_i$ to the active layer 112 decreases. In such a case, as is the case with the use of the differing film thicknesses as discussed above, the multi-film layer 110 can have a varying index of refraction with the nitride semiconductor films $110a_i$ and $110b_i$ having different indexes of refraction and, consequently, the multi-film layer 110 can exhibit substantially the same effects as those of a grading composition nitride semiconductor layer. It is to be noted that the index of refraction tends to decrease with decreasing amount of In used.

In another embodiment, the first and second nitride semiconductors layers 110a and 110b can be made of the same semiconductor material, thus creating a single layer 110 of a similar total thickness 122c to that of the multi-film layer 110 comprised of films 110a and 110b described above. The nitride multi-film layer 110 is made of a nitride semiconductor containing In, preferably a ternary compound which is expressed by the formula $In_xGa_{1-x}N$ (0<x<1), wherein x is preferably not greater than 0.5 and more preferably not greater than 0.1. This thick film enables a simpler method of depositing the film 110 since it only incorporates a single layer compared to the multi-layer film comprised of films 110a and 110b.

Again, in the practice of this embodiment, one or both of the first and second nitride semiconductor films 110a and 110b may be either undoped or doped with n-type impurity. To enhance the crystal quality, the first and second nitride semiconductor films 110a and 110b are preferably undoped, but may be modulation doped, or both of the first and second nitride semiconductor films 110a and 110b may be doped with the n-type impurity. Where both of the first and second nitride semiconductor films 110a and 110b are doped with the n-type impurity, the concentration of the n-type impurity in the one or more first nitride semiconductor films 110a may be different from the concentration in the one or more second nitride semiconductor films 110b.

In another embodiment, a transparent p-electrode 118 is formed on approximately the entire top surface of the p-contact layer 116, and a p-pad electrode 120 for bonding is formed on a portion of the p-electrode 118. Also, the emitting device 100 has a portion where a surface of the n-side nitride semiconductor layer 108 is exposed and an n-electrode 124 is formed thereon.

Embodiment 2

The nitride semiconductor light emitting device 126 according to embodiment 2, as shown in FIG. 2, has the same structure as in embodiment 1, except that the transparent p-contact layer 128 in embodiment 2 is comprised of a novel p-contact such as a TCO, thereby substituting the thin semi-transparent p-electrode layer 118 described in embodiment 1.

Specifically, the TCO 128 may be comprised of elements such as ZnO or ITO.

These layers 128 can be deposited in-situ, such as in an MOCVD reactor, or can be subsequently laminated in a separate deposition process. The TCO 128 can also be structurally bonded using an appropriate process.

Also, the TCO film or films 128 may comprise a plurality of different layers and compositions. They can also be unintentionally doped or intentionally doped with various elements in order to tailor the films' 128 properties, such as electrical conductivity and structural composition. The TCO layer 128 may be used as a p-type contact to the p-type nitride layer 116.

The TCO films 128 may comprise various thicknesses 130.

Embodiment 3

Figure 3:
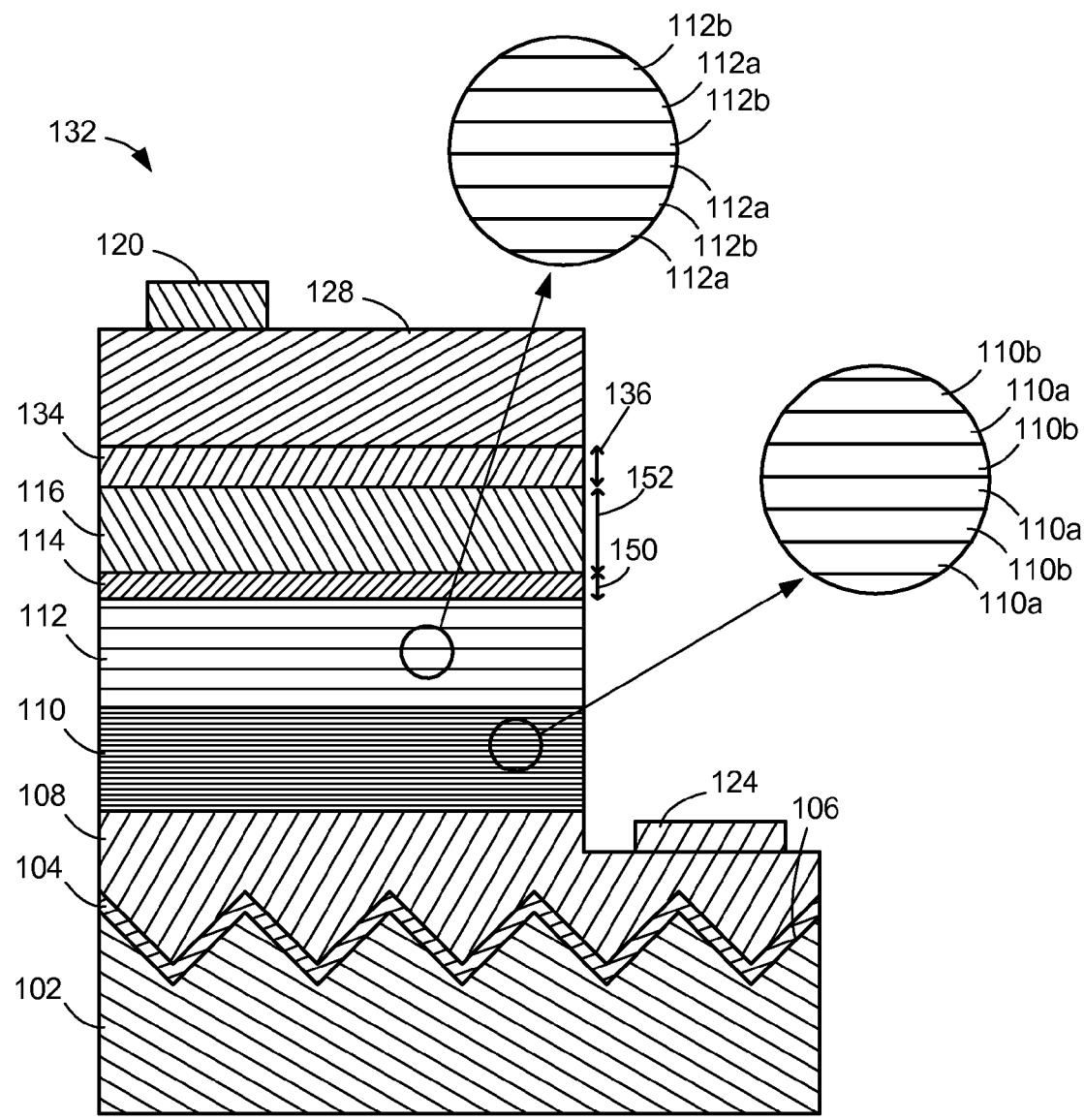
FIG. 3 is a cross sectional schematic showing the use of a tunnel junction layer located between the p-type semiconductor and the TCO.

The nitride semiconductor light emitting diode 132 according to embodiment 3, as shown in FIG. 3, has the same structure as embodiment 2, except that a tunnel junction layer 134 is laminated between the p-type GaN contact layer 116 and the TCO 128.

The tunnel junction layer 134 may be comprised of a nitride semiconductor which is intentionally doped with an n-type or p-type impurity, such as elements of silicon or magnesium, in order to control the conductivity of the layer 134. The tunnel junction layer 134 can be comprised of various thicknesses 136 and compositions. It 134 can also be comprised of a plurality of different layers. It 134 can also be doped with graded compositions or modulation doped.

For example, the tunnel junction layer 134 may be a nitride-based layer, comprising GaN, for example, or the tunnel junction layer may contains at least some indium.

Embodiment 4

Figure 4:
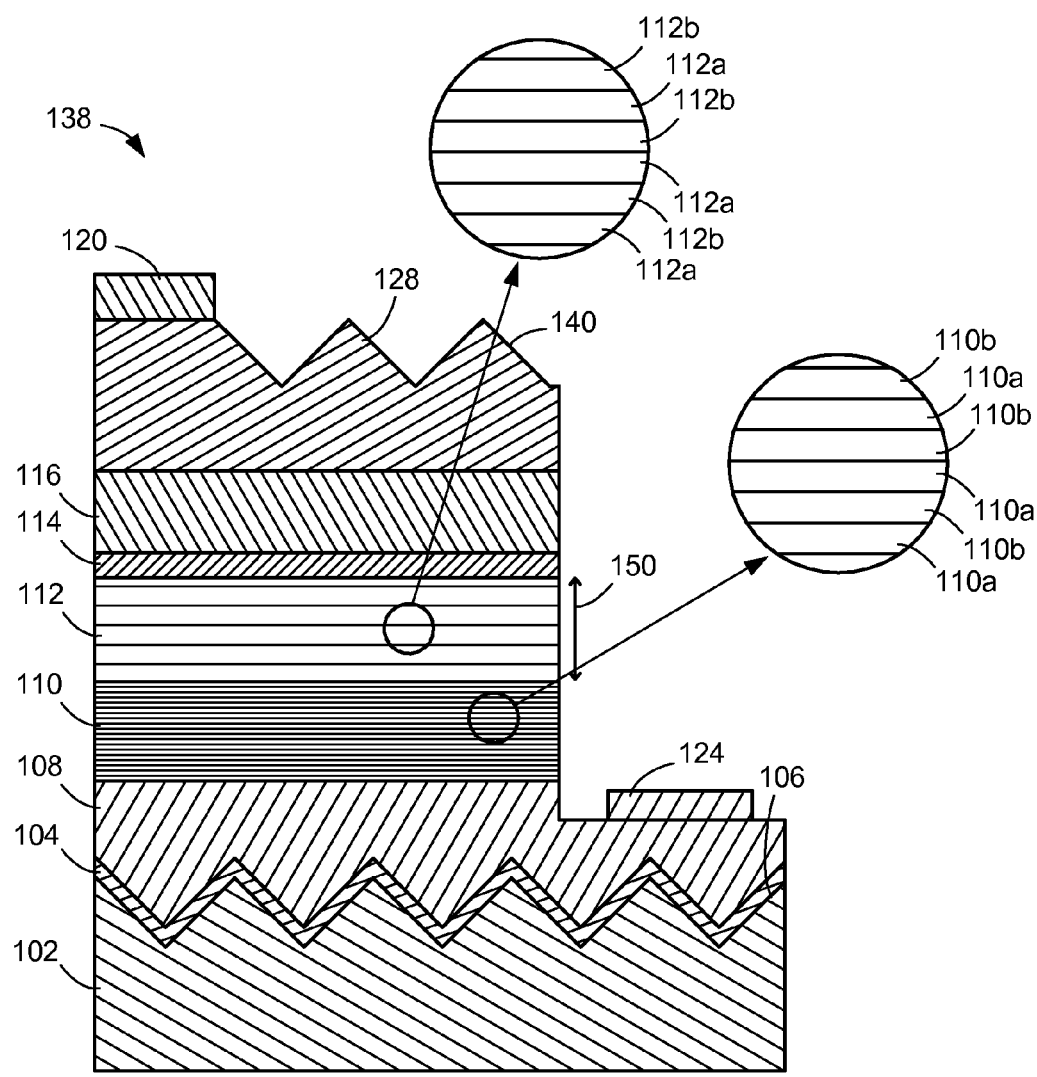
FIG. 4 is a cross sectional schematic of an LED showing patterning or shaping of the TCO.

The nitride semiconductor light emitting diode 138 according to embodiment 4, as shown in FIG. 4, has the same structure as embodiment 2 except that the TCO 128 is shaped (i.e. comprises a textured or patterned surface 140) in order to enhance light extraction from the device 140. The shaping 140 can be achieved through physical or chemical processes. The shaping 140 can also be comprised of various shapes and sizes.

Embodiment 5

Figure 5:
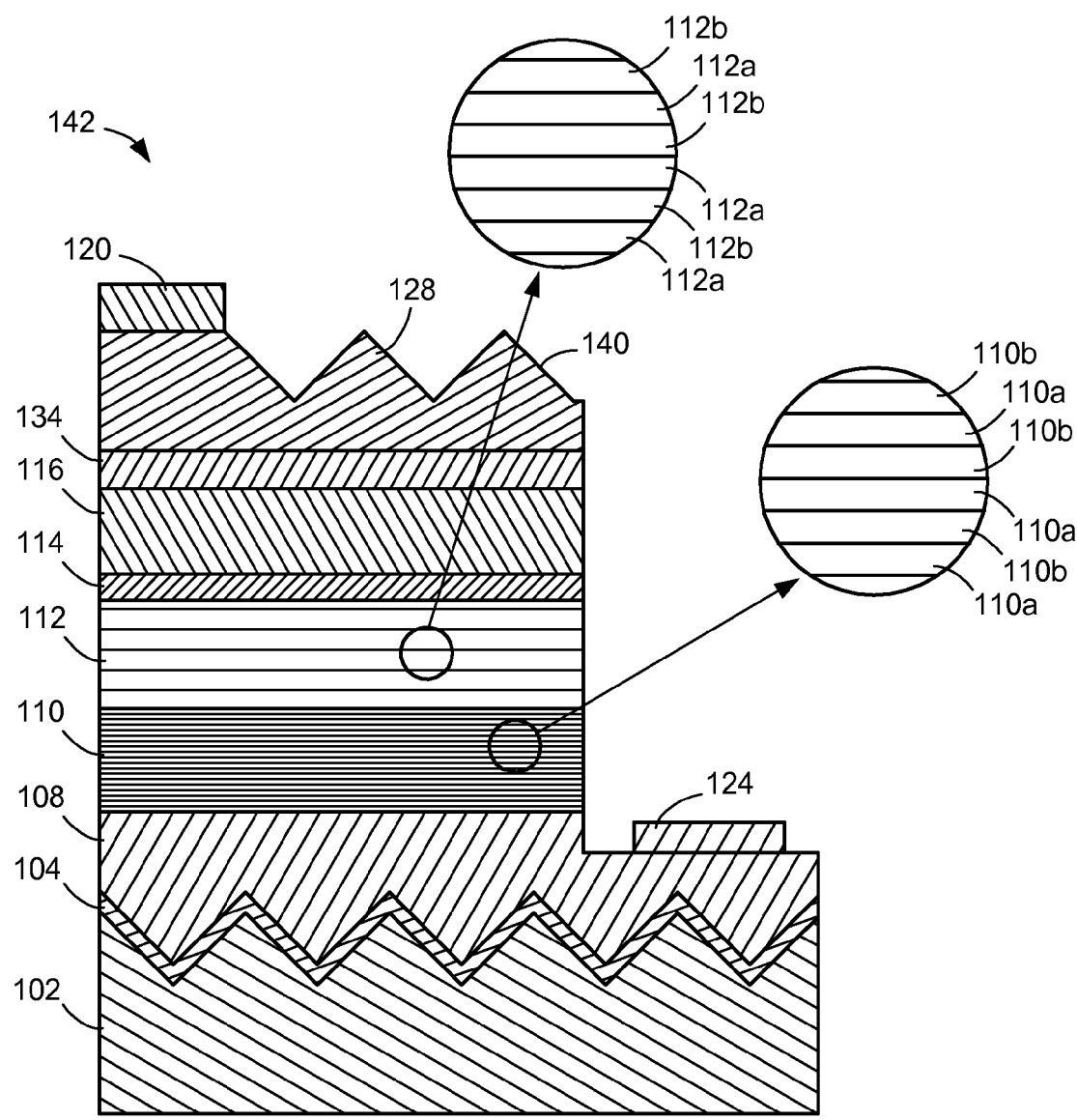
FIG. 5 is a cross sectional schematic of another LED showing patterning or shaping of the TCO.

The nitride semiconductor light emitting diode 142 according to embodiment 5, as shown in FIG. 5, has the same structure as embodiment 3, except that the TCO 128 is shaped (i.e. comprises a textured surface 140 in order to enhance light extraction from the device 142. The shaping 140 can be achieved through physical or chemical processes. The shaping 140 can also be comprised of various shapes and sizes.

Embodiment 6

Not all the layers described in FIGS. 1-5 are required. For example, embodiment 6 comprises a nitride light emitting diode or laser diode on a patterned substrate 102, comprising an n-type layer 108 and a p-type layer 116; a nitride interlayer 110, between the n-type layer 108 and the p-type layer 116, having at least two periods of alternating layers 110a and 110b of Indium (In) containing layers with a different In composition (one period comprises a stack of layer 110b on layer 110a (or layer 110a on layer 110b), and two periods comprises two layers 110a interleaved with two layers 110b, such as a stack comprising layer $110a_i$ on layer $110b_{i-1}$, layer $110b_i$ on layer $110a_i$, and layer $110a_{i+1}$ on layer $110b_i$); and a nitride based active region 112 formed on or above the nitride interlayer 110, and in between the n-type layer 108 and the p-type layer 116, wherein the active layer 112 may include at least one quantum well structure (barrier layer 112a and quantum well layer 112b). For example, the alternating layers may comprise a first layer 110a and a second layer 110b, wherein the first layer is $In_xGa_{1-x}N$, the second layer is $In_yGa_{1-y}N$, $0<x<1$ and $0\leq y<1$.

Process Steps

The following describes an example of a method for fabricating a device structure according to the present invention, and is illustrated by reference to FIGS. 1-5.

First, a patterned substrate 102 is loaded in a reactor and cleaned. In this example, a patterned sapphire substrate 102 (C-face) was set in the Metal Organic Vapor Phase Epitaxy (MOVPE) reactor and the temperature of the substrate 102 was increased to 1150° C. with hydrogen flow to clean the substrate 102. Instead of a C-face sapphire substrate 102, the substrate 102 may be a patterned sapphire substrate 102 having its principal surface represented by an R- or A-face, a patterned insulating substrate 102 of, for example, spinel ($MgAl_2O_4$), or a patterned semiconductor substrate 102 made of, for example, SiC (including 6H, 4H or 3C), Si, ZnO, GaAs, or GaN. The patterned substrate may be comprised of semipolar or nonpolar surfaces 106 of gallium nitride (GaN).

Subsequently to the increased temperature used above to clean the substrate 102, the temperature was decreased to 570° C. and a first buffer layer 104 made of GaN which had a thickness 144 of about 200 Angstroms was grown on the substrate 102, using hydrogen as a carrier gas, and ammonia and TMG (trimethylgallium) as material gases. Such a buffer layer 104 that is grown at a low temperature may be omitted, depending on the kind of the substrate 102, the growing method, etc.

After growing the buffer layer 104, only TMG was stopped and the temperature was increased to 1185° C. An n-contact layer 108, made of GaN doped with Si to $3\times10^{19}/cm^3$ and having a thickness 146 of 4 µm, was grown using ammonia and TMG as material gases in the same way as in the previous step, and silane gas as an impurity gas. This n-contact layer 108 may be made of $In_xAl_yGaN$ ($0\leq x$, $0\leq y$, $x+y<1$). The composition is not specifically limited to that composition, but preferably may be GaN and $Al_xGa_{1-x}N$ (wherein x is not greater than 0.2). In such a case, the nitride semiconductor layer 108 having a minimized crystal defect can easily be obtained.

The thickness 146 of the n-contact layer 108 is not specifically limited to any thickness 146, but the thickness 146 is typically not smaller than 4 µm because the n-electrode 124 is formed thereon. Moreover, the n-type impurity may be desirably doped in with a high concentration to the degree that the crystal quality of the nitride semiconductor 108 is not deteriorated and preferably in the concentration between $1\times10^{18}/cm^3$ and $5\times10^{21}/cm^3$.

Next, the temperature was decreased to 910° C. and a first nitride semiconductor film (layer 110a), made of undoped $In_{0.03}Ga_{0.97}N$ and having a thickness 122a of 25 Angstroms, was grown using TMG, TMI and ammonia. Subsequently, TMI was shut off, and a second nitride semiconductor film (layer 110b), made of GaN and having a thickness 122b of 25 Angstroms, was grown on the first film 110a. Then, these operations were repeated and the n-side multi-film (nitride interlayer film) 110 in the form of a superlattice structure, which had a thickness 122c of 250 nm, was formed by alternately laminating the first film 110a and the second film 110b, fifty times each, in the following order: first film 110a, second film 110b, first film 110a, and so on.

Next, a barrier layer 112a made of undoped GaN having a thickness 148a of 200 Angstroms was grown at 880° C., and a well layer 112b made of undoped $In_{0.4}Ga_{0.6}N$ which had a thickness 148b of 25 Angstroms was grown using TMG, TMI and ammonia. As shown in a magnified callout B in FIG. 1, an active layer 112 of the multiple quantum well structure having a total thickness 148c of 150 Angstroms was grown by laminating alternately seven barrier layers, layers 112a, and six well layers, layers 112b, in the order of barrier layer 112a, well layer 112b, barrier layer 112a, etc., and finishing on a barrier layer 112a. The active layer 112 was grown by laminating the barrier layer 112a first, but may be grown by laminating the well layer 112b first and also last. The active layer 112 may be grown by laminating in the well layer 112b first and the barrier layer 112a last, or the order may begin with the barrier layer 112a and end with the well layer 112b. Thus, the order of depositing the barrier 112a and well layers 112b is not specifically limited to a particular order.

The well layer 112b was set to have a thickness 148b of not greater than 100 Angstroms, preferably not greater than 70 Angstroms, and more preferably not greater than 50 Angstroms. A thickness 148b of greater than 100 Angstroms may make it difficult to increase the output of the device 100.

On the other hand, the barrier layer 112a was set to have a thickness 148a of not greater than 300 Angstroms, preferably not greater than 250 Angstroms, and most preferably not greater than 200 Angstroms.

The quantum well 112b may have a bandgap less than a bandgap of the nitride interlayer 110.

Next, using TMG, TMA, and ammonia, a third nitride semiconductor film 114, made of unintentionally doped $Al_{0.2}Ga_{0.8}N$ which had a thickness 150 of 200 Angstroms (for example), was grown. This AlGaN electron blocking layer 114 may be made of $In_xAl_yGaN$ ($0 \leq x$, $0 \leq y$, $x+y<1$). The composition is not specifically limited to this composition, but preferably may be $Al_xGa_{1-x}N$ (where x is not greater than 0.2).

Subsequently, at 910° C., using TMG, ammonia and $Cp_2Mg$, a p-contact layer 116 was grown, made of p-type GaN doped with Mg to $1\times10^{20}/cm^3$ which had a thickness 152 of 700 Angstroms (for example). The p-contact layer 116 may also be made of $In_xAl_yGa_{1-x-y}N$ ($0 \leq x$, $0 \leq y$, $x+y<1$). The composition is not specifically limited to this composition, but preferably may be GaN. In such a case, a nitride semiconductor layer 116 having minimized crystal defects can be obtained and an excellent ohmic contact with the p-electrode material 118 can be achieved.

Once the reactor has cooled, the nitride diode 100 is removed and annealed in a hydrogen deficient atmosphere for 15 minutes at a temperature of 700° C. in order to activate the p-type GaN 116.

Possible Modifications

The layer thicknesses and compositions described in the above disclosure are exemplary, and the present invention is not limited to these particular layer thicknesses and compositions. Indeed, the present invention is directed to a device or structure (e.g. active layers) grown atop a nitride film comprising a nitride interlayer (preferably a multifilm) on a substrate (preferably patterned). However, the interlayer may also be above the active layer.

Advantages and Improvements

Figure 6:
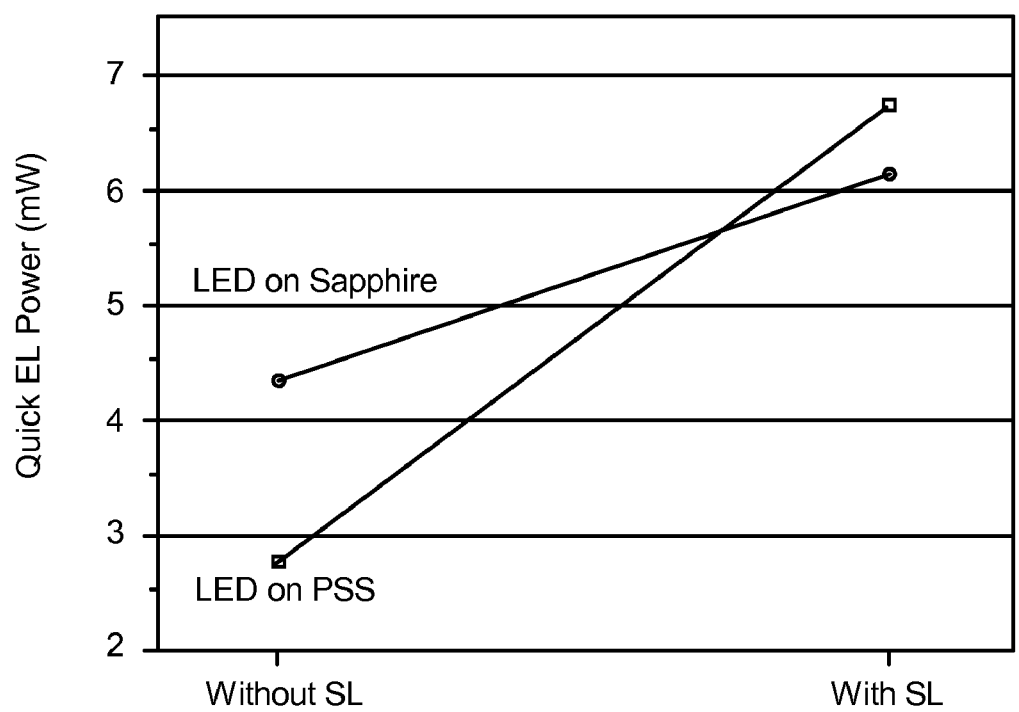
FIG. 6 shows the output power measured for LEDs with and without a superlattice (SL) containing some indium, on both patterned sapphire substrates (PSS) and non-patterned sapphire substrates.

FIG. 6 shows the "on wafer" output power measured for LEDs with and without a superlattice 110 containing some indium, on both patterned 102 and non-patterned sapphire substrates. The output power of the LEDs was evaluated by measuring the light output using a silicon photo detector through the back 154 of the substrate 102. This is commonly referred to as an "on-wafer" measurement. FIG. 6 indicates an increase in output power by using a superlattice (SL) 110, for samples on a non-patterned sapphire substrate and a patterned sapphire substrate (PSS) 102. However, it is also clear from FIG. 6 that the use of a superlattice 110 on a patterned substrate 102 leads to a significant increase in the output power of about 158%. This is in contrast to only a 42% increase in output power when a superlattice 110 is employed on a non-patterned sapphire substrate.

REFERENCES

The following references are incorporated by reference herein.

[1] K. Tadatomo, H. Okagawa, Y. Ohuchi, T. Tsunekawa, T. Jyouichi, Y. Imada, M. Kato, H. Kudo, and T. Taguchi, phys. stat. sol. (a) 188, No. 1, pp. 121-125 (2001).

[2] Motokazu Yamada, Tomotsugu Mitani, Yukio Narukawa, Shuji Shioji, Isamu Niki, Shinya Sonobe, Kouichiro Deguchi, Masahiko Sano and Takashi Mukai, Jpn. J. Appl. Phys. Vol. 41 (2002) pp. L 1431-L 1433, Part 2, No. 12B, 15 Dec. 2002.

[3] Shuji Nakamura, Takashi Mukai, Masayuki Senoh, Shin-ichi Nagahama, and Naruhito Iwasa, J. Appl. Phys. Vol. 74, No. 6 (1993) pp. 3911-3915, 15 Sep. 1993.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A nitride light emitting diode, comprising:
   an n-type layer, a nitride interlayer, a nitride based active region, and a p-type layer formed on a patterned substrate;
   wherein the nitride interlayer, formed between the n-type layer and the p-type layer, has at least two periods of alternating layers of Indium (In) containing layers with a different In composition; and
   wherein the nitride based active region, formed on or above the nitride interlayer, and in between the n-type layer and the p-type layer, includes at least one quantum well structure.

2. The nitride light emitting diode of claim 1, wherein the two periods of alternating layers comprise at least two first nitride layers interleaved with at least two second nitride layers.

3. The nitride light emitting diode of claim 2, wherein the first layers contain indium and the second layers contain substantially no indium.

4. The nitride light emitting diode of claim 1, wherein the two periods of alternating layers have a thickness smaller than a critical elastic thickness of a nitride, so that the nitride interlayer acts as a buffer layer for improving the crystal quality of the active region as compared to a structure where the alternating layers are grown with a thickness greater than the critical thickness.

5. The nitride light emitting diode of claim 1, wherein the alternating layers comprise a first layer and a second layer, and a first layer's thickness increases or decreases as a distance from the first layer to the active region decreases, in order to vary a refractive index of the alternating layers.

6. The nitride light emitting diode of claim 1, wherein the alternating layers comprise a first layer and a second layer, and a first layer's indium composition increases or decreases as a distance from the first layer to the active region decreases, in order to vary a refractive index of the alternating layers.

7. The nitride light emitting diode of claim 1, wherein the alternating layers comprise at least two first layers and at least two second layers, wherein the first layers are $In_xGa_{1-x}N$, the second layer are $In_yGa_{1-y}N$, $0<x<1$ and $0\leq y<1$.

8. The nitride light emitting diode of claim 1, wherein a bandgap of the at least one quantum well is less than a bandgap of the nitride interlayer.

9. The nitride light emitting diode of claim 1, further comprising at least one transparent conducting oxide (TCO) layer formed on top of the p-type nitride layer of the nitride light emitting diode, and a tunnel junction layer located between or adjacent the p-type nitride layer and the TCO layer.

10. The nitride light emitting diode of claim 9, wherein the transparent conducting oxide layer is used as a p-type contact to the p-type nitride layer.

11. The nitride light emitting diode of claim 1, wherein the patterned substrate is a patterned sapphire substrate having its principal surface represented by a c-face, r-face or a-face.

12. The nitride light emitting diode of claim 1, wherein the patterned substrate is a patterned sapphire insulating substrate of spinel, (MgAl2O4) a patterned semiconductor substrate made of SiC (including 6H, 4H or 3C), Si, ZnO, GaAs, or GaN.

13. The nitride light emitting diode of claim 1, wherein the patterned substrate is comprised of semipolar or nonpolar surfaces of gallium nitride (GaN).

14. A method of fabricating a nitride light emitting diode, comprising:
    forming an n-type layer, a nitride interlayer, a nitride based active region, and a p-type layer on a patterned substrate;
    wherein the nitride interlayer, formed between the n-type layer and the p-type layer, has at least two periods of alternating layers of Indium (In) containing layers with a different In composition; and
    wherein the nitride based active region, formed on or above the nitride interlayer, and in between the n-type layer and the p-type layer, includes at least one quantum well structure.

15. The method of fabricating a nitride light emitting diode of claim 14, wherein the two periods of alternating layers comprise at least two first nitride layers interleaved with at least two second nitride layers.

16. The method of fabricating a nitride light emitting diode of claim 15, wherein the first layers contain indium and the second layers contain substantially no indium.

17. The method of fabricating a nitride light emitting diode of claim 14, wherein the two periods of alternating layers have a thickness smaller than a critical elastic thickness of a nitride, so that the nitride interlayer acts as a buffer layer for improving the crystal quality of the active region as compared to a structure where the alternating layers are grown with a thickness greater than the critical thickness.

18. The method of fabricating a nitride light emitting diode of claim 14, wherein the alternating layers comprise a first layer and a second layer, and a first layer's thickness increases or decreases as a distance from the first layer to the active region decreases, in order to vary a refractive index of the alternating layers.

19. The method of fabricating a nitride light emitting diode of claim 14, wherein the alternating layers comprise a first layer and a second layer, and a first layer's indium composition increases or decreases as a distance from the first layer to the active region decreases, in order to vary a refractive index of the alternating layers.

20. The method of fabricating a nitride light emitting diode of claim 14, wherein the alternating layers comprise at least two first layers and at least two second layers, wherein the first layers are $In_xGa_{1-x}N$, the second layer are $In_yGa_{1-y}N$, $0<x<1$ and $0\leq y<1$.

21. The method of fabricating a nitride light emitting diode of claim 14, wherein a bandgap of the at least one quantum well is less than a bandgap of the nitride interlayer.

22. The method of fabricating a nitride light emitting diode of claim 14, further comprising at least one transparent conducting oxide (TCO) layer formed on top of the p-type nitride layer of the nitride light emitting diode, and a tunnel junction layer located between or adjacent the p-type nitride layer and the TCO layer.

23. The method of fabricating a nitride light emitting diode of claim 22, wherein the transparent conducting oxide layer is used as a p-type contact to the p-type nitride layer.

24. The method of fabricating a nitride light emitting diode of claim 14, wherein the patterned substrate is a patterned sapphire substrate having its principal surface represented by a c-face, r-face or a-face.

25. The method of fabricating a nitride light emitting diode of claim 14, wherein the patterned substrate is a patterned sapphire insulating substrate of spinel, (MgAl2O4), a patterned semiconductor substrate made of SiC (including 6H, 4H or 3C), Si, ZnO, GaAs, or GaN.

26. The method of fabricating a nitride light emitting diode of claim 14, wherein the patterned substrate is comprised of semipolar or nonpolar surfaces of gallium nitride (GaN).

27. A method of emitting light from a nitride light emitting diode, comprising:
    emitting light from a structure comprised of an n-type layer, a nitride interlayer, a nitride based active region, and a p-type layer formed on a patterned substrate;
    wherein the nitride interlayer, formed between the n-type layer and the p-type layer, has at least two periods of alternating layers of Indium (In) containing layers with a different In composition; and
    wherein the nitride based active region, formed on or above the nitride interlayer, and in between the n-type layer and the p-type layer, includes at least one quantum well structure.

* * * * *